(12) United States Patent
Takemori

(10) Patent No.: US 12,022,622 B2
(45) Date of Patent: Jun. 25, 2024

(54) CERAMIC ELECTRONIC COMPONENT

(71) Applicant: Murata Manufacturing Co., Ltd., Nagaokakyo (JP)

(72) Inventor: Yuki Takemori, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 16/166,204

(22) Filed: Oct. 22, 2018

(65) Prior Publication Data

US 2019/0059162 A1    Feb. 21, 2019

Related U.S. Application Data

(63) Continuation of application No. PCT/JP2017/016013, filed on Apr. 21, 2017.

(30) Foreign Application Priority Data

May 9, 2016    (JP) .................... 2016-094033

(51) Int. Cl.
*H05K 3/38*    (2006.01)
*H05K 1/09*    (2006.01)
(Continued)

(52) U.S. Cl.
CPC ............... *H05K 3/38* (2013.01); *H05K 1/09* (2013.01); *H05K 3/34* (2013.01); *H05K 3/388* (2013.01); *H05K 3/4644* (2013.01); *B32B 2305/80* (2013.01); *B32B 2457/08* (2013.01); *H05K 1/0271* (2013.01); *H05K 1/0306* (2013.01);
(Continued)

(58) Field of Classification Search
CPC ............ H05K 3/38; H05K 2201/0195; H05K 2201/0338; H05K 1/0271; B32B 2305/80; B32B 2457/08
See application file for complete search history.

(56) References Cited

U.S. PATENT DOCUMENTS

2005/0056458 A1    3/2005  Sugiura
2007/0224400 A1*   9/2007  Meguro ............. H01L 21/4807
                                                    428/209
(Continued)

FOREIGN PATENT DOCUMENTS

JP    S5015549 B1    6/1975
JP    2001326301 A   11/2001
(Continued)

OTHER PUBLICATIONS

International Search Report issued for PCT/JP2017/016013, date of mailing Jul. 18, 2017.
(Continued)

*Primary Examiner* — Jasper Saberi
(74) *Attorney, Agent, or Firm* — ArentFox Schiff LLP

(57) ABSTRACT

A ceramic electronic component that includes an electronic component body having a superficial base ceramic layer and a surface electrode on a surface of the electronic component body. The surface electrode includes a first sintered layer on the base ceramic layer, a second sintered layer on the first sintered layer, and a plating layer on the second sintered layer. A peripheral section of the first sintered layer has an exposed surface which is not overlaid with the second sintered layer or the plating layer.

12 Claims, 8 Drawing Sheets

(51) Int. Cl.
*H05K 3/34* (2006.01)
*H05K 3/46* (2006.01)
*H05K 1/02* (2006.01)
*H05K 1/03* (2006.01)
*H05K 3/40* (2006.01)

(52) U.S. Cl.
CPC ... *H05K 3/4007* (2013.01); *H05K 2201/0175* (2013.01); *H05K 2201/0195* (2013.01); *H05K 2201/0338* (2013.01)

(56) References Cited

U.S. PATENT DOCUMENTS

| | | | | |
|---|---|---|---|---|
| 2014/0057080 | A1* | 2/2014 | Iwakoshi | H01L 23/49811 428/157 |
| 2014/0284088 | A1* | 9/2014 | Nakamura | H05K 1/092 174/257 |
| 2015/0334834 | A1* | 11/2015 | Otomaru | H01L 23/49866 174/257 |
| 2016/0157341 | A1* | 6/2016 | Lee | H01L 23/49822 156/89.16 |

FOREIGN PATENT DOCUMENTS

| | | |
|---|---|---|
| JP | 2006173222 A | 6/2006 |
| JP | 2007201346 A | 8/2007 |
| WO | 2005004565 A1 | 1/2005 |
| WO | 2013061727 A1 | 5/2013 |
| WO | 2015016173 A1 | 2/2015 |

OTHER PUBLICATIONS

Written Opinion of the International Searching Authority issued for PCT/JP2017/016013, date of mailing Jul. 18, 2017.

* cited by examiner

CERAMIC ELECTRONIC COMPONENT

CROSS REFERENCE TO RELATED APPLICATIONS

The present application is a continuation of International application No. PCT/JP2017/016013, filed Apr. 21, 2017, which claims priority to Japanese Patent Application No. 2016-094033, filed May 9, 2016, the entire contents of each of which are incorporated herein by reference.

FIELD OF THE INVENTION

The present invention relates to a ceramic electronic component.

BACKGROUND OF THE INVENTION

For example, a multilayer ceramic electronic component such as a multilayer ceramic substrate is cited as a ceramic electronic component including an electronic component body and a surface electrode placed on a surface thereof.

A surface electrode included in such a ceramic electronic component is used to connect another electronic component such as a wiring board or a mounted component and therefore the bond strength between the surface electrode and an electronic component body must be high.

Patent Document 1 discloses a ceramic electronic component including a connection electrode which corresponds to a surface electrode and which includes at least two layers. In the invention disclosed in Patent Document 1, it is characteristic that an inside layer in contact with a surface of an electronic component body contains a conductive component and a ceramic component and an outside layer facing an outer side portion of the connection electrode contains a glass component.

Patent Document 1: Japanese Unexamined Patent Application Publication No. 2001-326301

SUMMARY OF THE INVENTION

According to Patent Document 1, since the inside layer of the connection electrode contains the ceramic component, the bond strength between the inside layer and the electronic component body can be increased and since the outside layer of the connection electrode contains the glass component, the bond strength between the outside layer and the inside layer can be increased.

However, in the case where the ceramic electronic component described in Patent Document 1 is connected to another electronic component with the connection electrode interposed therebetween, particularly in the case where the ceramic electronic component is mounted on a wiring board, there has been a problem in that when stress is applied to the connection electrode from outside, cracks occur in the connection electrode and/or the electronic component body to reduce the connection reliability of the ceramic electronic component.

The present invention has been made to solve the above problem. It is an object of the present invention to provide a ceramic electronic component in which the bond strength between a surface electrode and an electronic component body is high and which can withstand the stress applied to the surface electrode from outside.

In order to achieve the above object, a ceramic electronic component according to the present invention includes an electronic component body including a superficial base ceramic layer and a surface electrode on a surface of the electronic component body. The surface electrode includes a first sintered layer on the upper surface of the base ceramic layer, a second sintered layer on the upper surface of the first sintered layer, and a plating layer on the upper surface of the second sintered layer. A peripheral section of the first sintered layer has an exposed surface which is not overlaid with the second sintered layer or the plating layer.

In the ceramic electronic component according to the present invention, the surface electrode has an at least three-layer structure composed of the first sintered layer, the second sintered layer, and the plating layer. Adjusting the size of the first sintered layer above the size of the plating layer and the size of the second sintered layer allows the exposed surface to be formed in the upper surface of the peripheral section of the first sintered layer and allows the second sintered layer and the plating layer to be placed inside the first sintered layer.

When the size of an outside layer of a connection electrode is the same as the size of an inside layer thereof, as is the case with the ceramic electronic component described in Patent Document 1, the stress applied to the connection electrode from outside is concentrated at an end portion of the connection electrode. As a result, cracks probably occur in the connection electrode and/or the electronic component body.

However, in the ceramic electronic component according to the present invention, the size of the first sintered layer is greater than the size of the second sintered layer and the size of the plating layer. Therefore, the origin of stress from outside can be shifted from an end portion of the surface electrode that has low bond strength because the first sintered layer and the base ceramic layer are bonded to each other to the inside of the surface electrode that has high bond strength because metals in the first and second sintered layers are coupled to each other. As a result, the bond strength between the surface electrode and the electronic component body can be increased to a level sufficient to withstand the stress applied to the surface electrode from outside. Therefore, cracks can be prevented from occurring in the surface electrode and/or the electronic component body.

Incidentally, the bond strength between the surface electrode and the electronic component body can be evaluated by the peeling strength determined by an electrode tensile test and the drop strength determined by a drop test.

Furthermore, in the ceramic electronic component according to the present invention, since the size of the first sintered layer is greater than the size of the second sintered layer and the size of the plating layer, the bond strength between the first sintered layer and the base ceramic layer can be increased.

In the ceramic electronic component according to the present invention, the length of the inner edge of the exposed surface is preferably 50% or more of the length of a peripheral section of the second sintered layer from the viewpoint of increasing the bond strength between the surface electrode and the base ceramic layer.

In the ceramic electronic component according to the present invention, the width of the exposed surface is preferably 10 μm or more from the viewpoint of increasing the bond strength between the surface electrode and the base ceramic layer.

In the ceramic electronic component according to the present invention, the first sintered layer preferably contains a metal oxide containing at least one metal element selected from the group consisting of Al, Zr, Ti, Si, and Mg.

The surface electrode excluding the plating layer is preferably formed by firing together with firing for obtaining the electronic component body. When the first sintered layer contains the metal oxide, the bond strength between the first sintered layer and the base ceramic layer can be increased because the metal oxide can be bonded to a ceramic component or glass component contained in the base ceramic layer.

Furthermore, when the first sintered layer contains the metal oxide, the necking of a conductive component (that is, metal) contained in the first sintered layer is inhibited during firing and therefore the ceramic component or glass component contained in the base ceramic layer is likely to move to the upper surface of the first sintered layer in the form of a liquid phase. As a result, the upper surface of the first sintered layer that is not overlaid with the second sintered layer can be maintained unplatable. Therefore, in the case of performing plating after the first sintered layer and the second sintered layer are formed, the exposed surface can be readily formed in the upper surface of the peripheral section of the first sintered layer.

In the ceramic electronic component according to the present invention, the second sintered layer preferably contains a smaller amount of the metal oxide as compared to the first sintered layer.

In this case, the upper surface of the first sintered layer can be maintained unplatable and the upper surface of the second sintered layer can be maintained platable.

In the ceramic electronic component according to the present invention, the content of the metal oxide at the exposed surface of the first sintered layer is preferably higher than the content of the metal oxide at a boundary surface of the first sintered layer that is in contact with the base ceramic layer.

By adjusting the content of the metal oxide at the exposed surface of the first sintered layer that is not overlaid with the second sintered layer above the content of the metal oxide at the boundary surface of the first sintered layer that is in contact with the base ceramic layer, the upper surface of the first sintered layer can be maintained unplatable. Furthermore, the bond strength between the surface electrode and the electronic component body can be further increased.

It is preferable that the ceramic electronic component according to the present invention further includes a covering ceramic layer covering the peripheral section of the surface electrode and the covering ceramic layer covers the exposed surface of the first sintered layer.

Providing the covering ceramic layer, which is called a framing layer, on the peripheral section of the surface electrode enables the deterioration of high-frequency characteristics of the surface electrode to be prevented.

Furthermore, providing the covering ceramic layer such that the covering ceramic layer covers the exposed surface of the first sintered layer enables the distance between the covering ceramic layer and the base ceramic layer to be reduced as compared to providing the covering ceramic layer such that the covering ceramic layer covers a peripheral section of a second sintered layer laminated with a first sintered layer having no exposed surface. When the first sintered layer contains the metal oxide, the close contact between the covering ceramic layer and the first sintered layer can be increased. As a result, since the close contact between the covering ceramic layer and the surface electrode can be increased. Therefore, even if the ceramic electronic component is subjected to a surface treatment such as blasting, the covering ceramic layer can be prevented from being peeled from the surface electrode.

According to the present invention, a ceramic electronic component in which the bond strength between a surface electrode and an electronic component body is high and which can withstand the stress applied to the surface electrode from outside can be provided.

DETAILED DESCRIPTION OF THE PREFERRED EMBODIMENTS

An embodiment of a ceramic electronic component according to the present invention is described below.

However, the present invention is not limited to configurations below. Various modifications can be made without departing from the spirit of the present invention.

Combinations of two or more of individual preferred configurations of the present invention that are described below are also included in the present invention.

Embodiments below are illustrative and the partial replacement or combination of configurations described in different embodiments can be made. In a second embodiment and subsequent embodiments, items common to those described in a first embodiment are not described in detail but only items different from those described therein are described. In particular, similar effects due to similar configurations are not mentioned one by one in each embodiment.

In the embodiments below, the case where a ceramic electronic component is a multilayer ceramic electronic component such as a multilayer ceramic substrate, that is, the case where an electronic component body has a multilayer structure composed of a plurality of laminated ceramic layers is described. However, the present invention is not limited to the multilayer electronic component and is applicable to various ceramic electronic components in which an electronic component body includes a superficial base ceramic layer and in which a surface electrode is placed on a surface of the electronic component body.

First Embodiment

Figure 1:
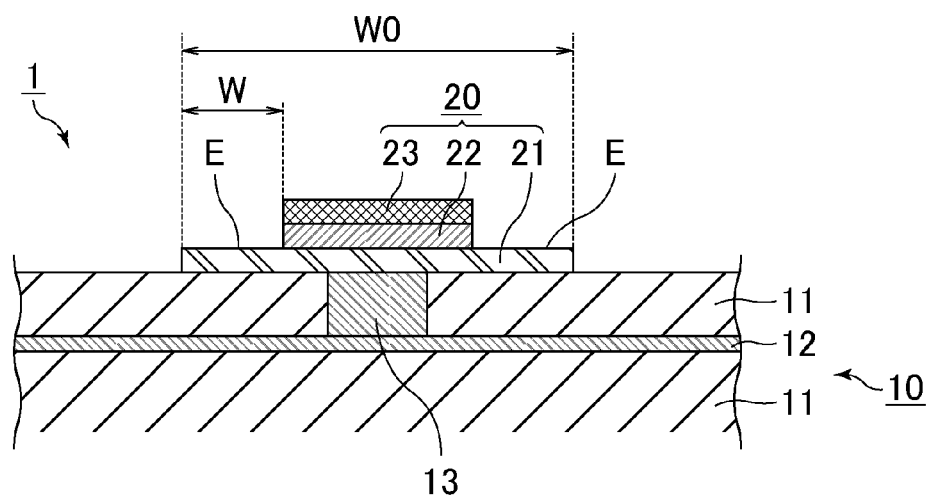
FIG. 1 is a schematic sectional view of an example of a ceramic electronic component according to a first embodiment of the present invention.

FIG. 1 is a schematic sectional view of an example of a ceramic electronic component according to the first embodiment of the present invention.

The ceramic electronic component 1, of which the overall configuration is not shown in FIG. 1, includes an electronic component body 10 including a superficial base ceramic layer 11 and a surface electrode 20 placed on a surface of the electronic component body 10. The surface electrode 20 has a three-layer structure and includes a first sintered layer 21 placed on the upper surface of the base ceramic layer 11, which is located at a surface of the electronic component body 10; a second sintered layer 22 placed on the upper surface of the first sintered layer 21; and a plating layer 23 placed on the upper surface of the second sintered layer 22.

A peripheral section of the first sintered layer 21 has an exposed surface E which is not overlaid with the second sintered layer 22 or the plating layer 23.

Referring to FIG. 1, the electronic component body 10 has a multilayer structure composed of a plurality of laminated base ceramic layers 11 and an inner conductive film 12 and via-hole conductor 13 serving as inner wiring conductors are placed in the electronic component body 10. The inner conductive film 12 is electrically connected to the via-hole conductor 13. The via-hole conductor 13 is electrically connected to the surface electrode 20.

The base ceramic layers included in the electronic component body preferably contain a low-temperature co-fired ceramic material.

The low-temperature co-fired ceramic material refers to, among ceramic materials, a material which can be sintered at a firing temperature of 1,000° C. or less and which can be co-fired with Ag or Cu.

Examples of the low-temperature co-fired ceramic material, which is contained in the base ceramic layers, include glass composite low-temperature co-fired ceramic materials formed by mixing borosilicate glass with ceramic materials such as quartz, alumina, and forsterite; crystal glass low-temperature co-fired ceramic materials containing ZnO—MgO—$Al_2O_3$—$SiO_2$ crystal glass; and non-glass low-temperature co-fired ceramic materials formed using BaO—$Al_2O_3$—$SiO_2$ ceramic materials or $Al_2O_3$—CaO—$SiO_2$—MgO—$B_2O_3$ ceramic materials.

Inner wiring conductors (the inner conductive film and the via-hole conductor), which are placed in the electronic component body, contain a conductive component. Examples of the conductive component, which is contained in the inner wiring conductors, include Au, Ag, Cu, Pt, Ta, W, Ni, Fe, Cr, Mo, Ti, Pd, Ru, and alloys mainly containing one of these metals. The inner wiring conductors preferably contain Au, Ag, or Cu and more preferably Ag or Cu as a conductive component. Au, Ag, and Cu have low resistance and are therefore particularly suitable for the case where the multilayer ceramic substrate is for use in high-frequency applications.

The surface electrode, which is placed on the surface of the electronic component body, is one connected to another electronic component such as a wiring board or a mounted component. The surface electrode is connected to the other electronic component by soldering or the like.

The surface electrode has an at least three-layer structure including the first sintered layer, which is placed on the upper surface of the base ceramic layer located at the surface of the electronic component body; the second sintered layer, which is placed on the upper surface of the first sintered layer; and the plating layer, which is placed on the upper surface of the second sintered layer.

The first and second sintered layers are those formed by baking a conductive paste and the plating layer is one formed by electroplating or electroless plating after the first and second sintered layers are formed.

The first sintered layer, which is included in the surface electrode, contains a conductive component. In order to increase the bond strength to the electronic component body, the first sintered layer preferably further contains a metal oxide.

Examples of the conductive component contained in the first sintered layer include Au, Ag, Cu, Pt, Ta, W, Ni, Fe, Cr, Mo, Ti, Pd, Ru, and alloys mainly containing one of these metals. The first sintered layer preferably contains the same conductive component as that contained in the inner wiring conductors. In particular, the first sintered layer preferably contains Au, Ag, or Cu and more preferably Ag or Cu as a conductive component.

The metal oxide contained in the first sintered layer is, for example, a metal oxide containing at least one metal element selected from the group consisting of Al, Zr, Ti, Si, and Mg. The metal oxide may be used alone or in combination with one or more metal oxides. Among these, a metal oxide containing at least one metal element selected from the group consisting of Al, Zr, and Ti is preferable and a metal oxide containing Al element is more preferable.

The content of the metal oxide in the first sintered layer is not particularly limited and is preferably higher than the content of the metal oxide in the second sintered layer. In particular, the content of the metal oxide in the first sintered layer is preferably 1% by weight or more and more preferably 3% by weight or more. On the other hand, the content of the metal oxide in the first sintered layer is preferably less than 10% by weight and more preferably less than 5% by weight.

When the first sintered layer contains the metal oxide, particles of metal contained in the conductive component and particles of the metal oxide may be present in a dispersed state and surroundings of the metal particles may be covered by the metal oxide. The surroundings of the metal particles are preferably covered by the metal oxide. When the surroundings of the metal particles are covered by the metal oxide, the bond strength to the electronic component body can be increased even if the content of the metal oxide is low.

As described above, the peripheral section of the first sintered layer has the exposed surface, which is not overlaid with the second sintered layer or the plating layer. The exposed surface is preferably present over the whole of the peripheral section of the first sintered layer and at least one portion of the peripheral section of the first sintered layer may have the exposed surface. The peripheral section of the first sintered layer may have a plurality of exposed surfaces.

From the viewpoint of increasing the bond strength between the surface electrode and the base ceramic layer, the length of the inner edge of the exposed surface is preferably 10% or more of the length of the peripheral section of the second sintered layer, more preferably 50% or more, further more preferably 70% or more, particularly preferably 90% or more, and most preferably 100%.

When the planar shape of the second sintered layer is, for example, square and the exposed surface is exposed from two sides thereof, it can be said that "the length of the inner edge of the exposed surface is 50% of the length of a peripheral section of the second sintered layer" regardless of the width of the exposed surface.

From the viewpoint of increasing the bond strength between the surface electrode and the base ceramic layer, the width (the length represented by W in FIG. 1) of the exposed surface is preferably 4.5% or more of the width (the length represented by W0 in FIG. 1) of the surface electrode and more preferably 10% or more. On the other hand, the width of the exposed surface is preferably 50% or less of the width of the surface electrode and more preferably 25% or less. In particular, the width of the exposed surface is preferably 3 μm or more, more preferably 5 μm or more, and further more preferably 10 μm or more. On the other hand, the width of the exposed surface is preferably 100 μm or less and more preferably 50 μm or less.

Incidentally, the width of the exposed surface and the width of the surface electrode can be both measured by cross-sectional observation using a scanning electron microscope (SEM).

In this specification, the width of the exposed surface refers to the distance from the periphery of the first sintered layer to the periphery of the second sintered layer. The width of the surface electrode refers to the distance from one periphery of the surface electrode to the other periphery in a cross section used to measure the width of the exposed surface.

The area of the exposed surface is not particularly limited. From the viewpoint of increasing the bond strength between the surface electrode and the base ceramic layer, the area of the exposed surface is preferably 0.1% or more of the area of the upper surface of the first sintered layer and more preferably 1% or more. On the other hand, the area of the exposed surface is preferably 50% or less of the area of the upper surface of the first sintered layer and more preferably 10% or less.

The planar shape of the first sintered layer including the exposed surface is not particularly limited and is, for example, rectangular, tetragonal, polygonal rather than tetragonal, circular, or oval.

The second sintered layer, which is included in the surface electrode, contains a conductive component. The conductive component contained in the second sintered layer is preferably the same as the conductive component contained in the first sintered layer.

The second sintered layer may contain the same metal oxide as the metal oxide contained in the first sintered layer. When the content of the metal oxide therein is high, the upper surface of the second sintered layer is unlikely to be plated. Therefore, the second sintered layer preferably contains a smaller amount of the metal oxide as compared to the first sintered layer and more preferably contains substantially no metal oxide. In the case where the second sintered layer contains the metal oxide, the content of the metal oxide in the second sintered layer is preferably less than 1% by weight when the content of the metal oxide in the first sintered layer is 1% by weight to less than 10% by weight. When the content of the metal oxide in the first sintered layer is 3% by weight to less than 5% by weight, the content of the metal oxide in the second sintered layer is preferably less than 3% by weight and more preferably less than 1% by weight.

The area of the upper surface of the second sintered layer is not particularly limited and may be less than the area of the upper surface of the first sintered layer. The planar shape of the second sintered layer is not particularly limited and is, for example, rectangular, tetragonal, polygonal rather than tetragonal, circular, or oval. The planar shape of the second sintered layer is preferably substantially similar to the planar shape of the first sintered layer, that is, the periphery of the second sintered layer is preferably substantially parallel to the periphery of the first sintered layer.

The number of sintered layers is not limited to two and another sintered layer may be placed between the first sintered layer, which is placed on the upper surface of the base ceramic layer, and the second sintered layer, which is overlaid with the plating layer.

The plating layer, which is included in the surface electrode, is preferably made of Au, Ag, Ni, Pd, Cu, Sn, or an alloy containing these metals. The plating layer, which is included in the surface electrode, may be a plating layer composed of a plurality of sublayers such as a nickel plating sublayer and gold plating sublayer that are the first sublayer and the second sublayer, respectively, from the second sintered layer side; a nickel plating sublayer and tin plating sublayer that are the first sublayer and the second sublayer, respectively, from the second sintered layer side; and a nickel plating sublayer, palladium plating sublayer, and gold plating sublayer that are the first sublayer, the second sublayer, and the third sublayer, respectively, from the second sintered layer side.

It is preferable that the area of the upper surface of the plating layer is less than the area of the upper surface of the first sintered layer and is the same as or less than the area of the upper surface of the second sintered layer. The planar shape of the plating layer is not particularly limited and is preferably the same as the planar shape of the second sintered layer.

The thickness of the plating layer is not particularly limited and is preferably 1 μm to 10 μm.

Figure 2A:
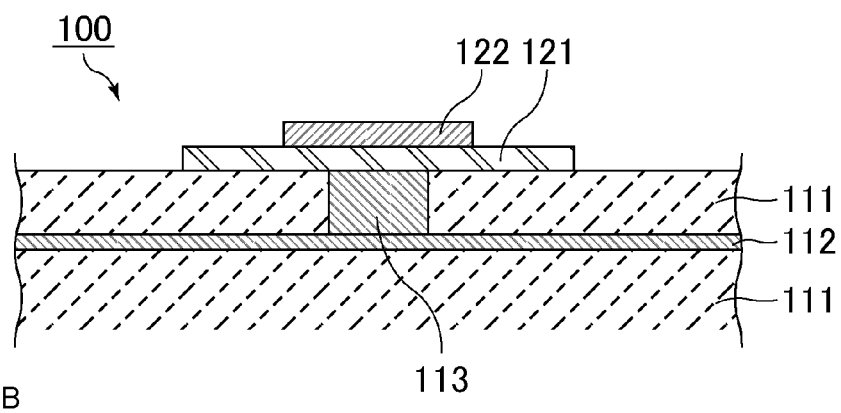
FIGS. 2A to 2C are schematic sectional views showing an example of a method for manufacturing the ceramic electronic component 1 shown in FIG. 1.
Figure 2B:
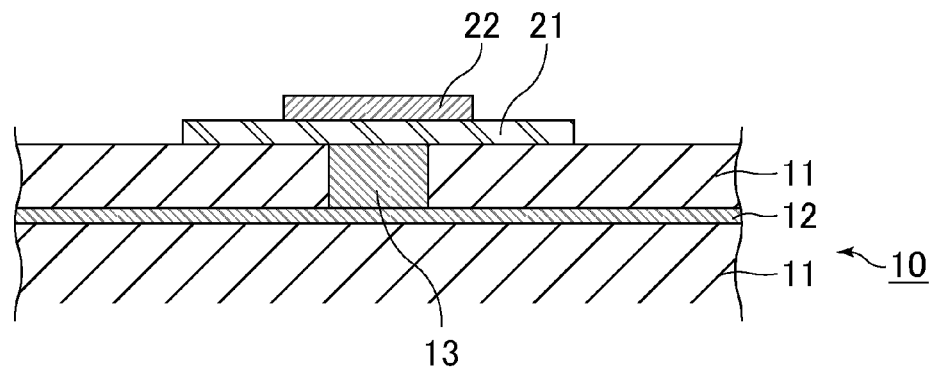
Figure 2C:
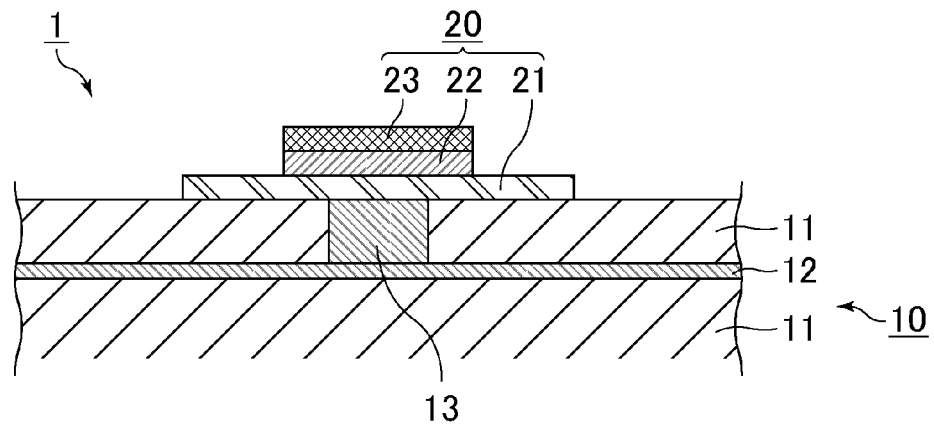

The ceramic electronic component 1 shown in FIG. 1 is preferably manufactured as described below. FIGS. 2A to 2C are schematic sectional views showing an example of a method for manufacturing the ceramic electronic component 1 shown in FIG. 1.

First, an unsintered multilayer body 100 is prepared as shown in FIG. 2A.

In order to prepare the unsintered multilayer body 100, a plurality of base ceramic green sheets 111 are prepared. The base ceramic green sheets 111 are those converted into the base ceramic layers 11 after firing.

The base ceramic green sheets are those obtained by forming, for example, slurry containing a powder of a ceramic raw material such as a low-temperature co-fired ceramic material, an organic binder, and a solvent into sheets by a doctor blade process or the like. The slurry may contain various additives such as a dispersant and a plasticizer.

The organic binder contained in the slurry may be, for example, a butyral resin (polyvinyl butyral), an acrylic resin, a methacrylic resin, or the like. The solvent may be, for example, toluene, an alcohol such as isopropyl alcohol, or the like. The plasticizer may be, for example, di-n-butyl phthalate or the like.

Next, a through-hole for forming the via-hole conductor 13 is formed in a specific one of the base ceramic green sheets 111. The through-hole is filled with a conductive paste containing, for example, Ag or Cu as a conductive component, whereby a conductive paste body 113 to be converted into the via-hole conductor 13 is formed.

A conductive paste film 112 to be converted into the inner conductive film 12 is formed on a specific one of the base ceramic green sheets 111 by, for example, a process such as screen printing using a conductive paste having the same composition as that of the above conductive paste.

Furthermore, a conductive paste film 121 to be converted into the first sintered layer 21 is formed on a superficial base ceramic green sheet 111 after stacking. A conductive paste film 122 to be converted into the second sintered layer 22 is formed on the conductive paste film 121. The conductive paste film 121 to be converted into the first sintered layer 21 can be formed by a process such as screen printing using, for example, a conductive paste containing Ag or Cu as a conductive component and $Al_2O_3$ as a metal oxide. The conductive paste film 122 to be converted into the second sintered layer 22 can be formed by a process such as screen printing using, for example, a conductive paste containing Ag or Cu as a conductive component. In this operation, the size of the conductive paste film 121 to be converted into the first sintered layer 21 is adjusted above the size of the conductive paste film 122 to be converted into the second sintered layer 22. Incidentally, after the base ceramic green sheets 111 are stacked, the conductive paste film 121 to be converted into the first sintered layer 21 and the conductive paste film 122 to be converted into the second sintered layer 22 may be formed before firing. Examples of the metal oxide contained in the conductive paste include $Al_2O_3$, $ZrO_2$, $TiO_2$, $SiO_2$, and MgO. Among these oxides, $Al_2O_3$ is preferably used.

Subsequently, a plurality of base ceramic green sheets 111 are stacked and are then pressure-bonded, whereby the unsintered multilayer body 100 is prepared.

Thereafter, the unsintered multilayer body 100 is fired. This allows the following body to be obtained as shown in FIG. 2B: a multilayer body including the electronic component body 10, which includes the superficial base ceramic layer 11; the first sintered layer 21, which is placed on the upper surface of the base ceramic layer 11; and the second sintered layer 22, which is placed on the upper surface of the first sintered layer 21.

Incidentally, the first sintered layer and the second sintered layer can be formed in such a manner that the conductive paste films are formed on a surface of the sintered electronic component body and are fired. The first sintered layer and the second sintered layer are preferably formed in such a manner that the conductive paste films are fired together with firing for obtaining the electronic component body as described above. Forming the first sintered layer and the second sintered layer by co-firing is advantageous in streamlining manufacturing steps and in reducing manufacturing costs and enables the bond strength between the electronic component body and the first sintered layer to be increased. In the case of forming the first sintered layer and the second sintered layer by co-firing, the base ceramic layers included in the electronic component body preferably contain the low-temperature co-fired ceramic material as described above.

After the unsintered multilayer body 100 is fired, the plating layer 23 is formed on the upper surface of the second sintered layer 22 by electroplating or electroless plating as shown in FIG. 2C. For the plating layer 23, it is preferable that a Ni plating film is formed on the second sintered layer 22 and an Au or Sn plating film is formed thereon.

The above allows the ceramic electronic component 1, in which the surface electrode 20 including the first sintered layer 21, the second sintered layer 22, and the plating layer 23 is placed on a surface of the electronic component body 10, to be obtained.

In the above method, since the conductive paste to be formed into the first sintered layer contains the metal oxide, no plating layer is formed on the upper surface of the first sintered layer. However, since the conductive paste to be formed into the second sintered layer contains no metal oxide, the plating layer is formed on the upper surface of the second sintered layer. As a result, the exposed surface, which is not overlaid with the second sintered layer or the plating layer, is formed in the peripheral section of the first sintered layer.

A method for forming the exposed surface in the peripheral section of the first sintered layer is not limited to the above method and may be, for example, a method in which a mask is provided on the peripheral section of the first sintered layer and no plating layer is thereby formed on a masked portion. In this case, the conductive paste to be formed into the first sintered layer may contain the metal oxide or may contain no metal oxide.

In the first embodiment of the present invention, forming the exposed surface, which is not overlaid with the second sintered layer or the plating layer, in the upper surface of the peripheral section of the first sintered layer enables the second sintered layer and the plating layer to be placed inside the first sintered layer. As a result, the bond strength between the surface electrode and the electronic component body can be increased to a level sufficient to withstand the stress applied to the surface electrode from outside. Therefore, cracks can be prevented from occurring in the surface electrode and/or the electronic component body.

Second Embodiment

Figure 3:
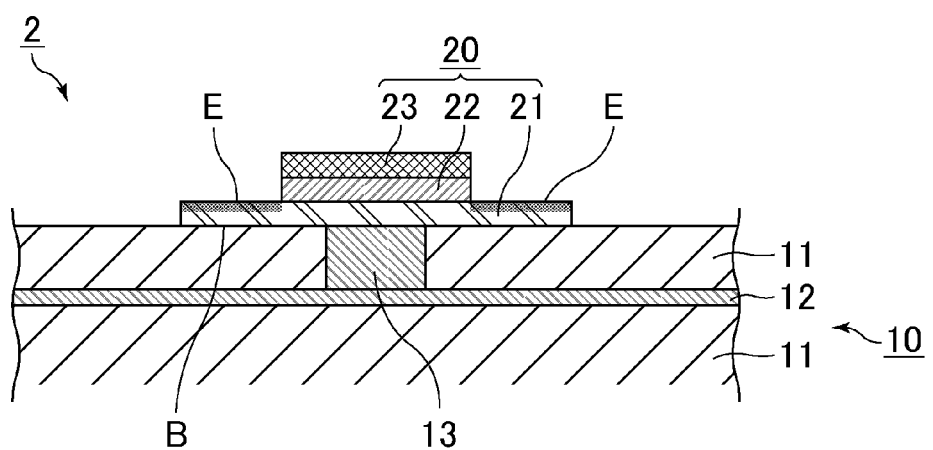
FIG. 3 is a schematic sectional view of an example of a ceramic electronic component according to a second embodiment of the present invention.

FIG. 3 is a schematic sectional view of an example of a ceramic electronic component according to a second embodiment of the present invention.

The ceramic electronic component 2, of which the overall configuration is not shown in FIG. 3, includes an electronic component body 10 including a superficial base ceramic layer 11 and also includes a surface electrode 20 placed on a surface of the electronic component body 10. The surface electrode 20 has a three-layer structure and includes a first sintered layer 21 placed on the upper surface of the base ceramic layer 11, which is located at a surface of the electronic component body 10; a second sintered layer 22 placed on the upper surface of the first sintered layer 21; and a plating layer 23 placed on the upper surface of the second sintered layer 22.

A peripheral section of the first sintered layer 21 has an exposed surface E which is not overlaid with the second sintered layer 22 or the plating layer 23.

In the ceramic electronic component 2 shown in FIG. 3, the content of a metal oxide at the exposed surface E of the first sintered layer 21 is higher than the content of the metal oxide at a boundary surface B of the first sintered layer 21 that is in contact with the base ceramic layer 11.

In this specification, the term "the content of a metal oxide at the exposed surface of the first sintered layer" refers to the content of the metal oxide in a region ranging from the exposed surface of the first sintered layer to one-tenth of the thickness of the first sintered layer in the thickness direction. Likewise, the term "the content of a metal oxide at a boundary surface B of the first sintered layer that is in contact with the base ceramic layer" refers to the content of the metal oxide in a region ranging from the boundary surface of the first sintered layer that is in contact with the base ceramic layer to one-tenth of the thickness of the first sintered layer in the thickness direction.

The content of the metal oxide is calculated in such a manner that a region of a measured target is analyzed by mapping using FE-EPMA (device name: JXA-8530F manufactured by JEOL Ltd.) and the area fraction of a portion in which the metal oxide (for example, $Al_2O_3$ or $SiO_2$) is present is determined.

The ceramic electronic component according to the second embodiment of the present invention has the same configuration as that of the ceramic electronic component according to the first embodiment except that the content of the metal oxide at the exposed surface of the first sintered layer is higher than the content of the metal oxide at the boundary surface of the first sintered layer that is in contact with the base ceramic layer.

Thus, in the second embodiment of the present invention, the configuration of the electronic component body is the same as that described in the first embodiment and a preferable material for the base ceramic layer included in the electronic component body is the same as that described in the first embodiment. A conductive component contained in the first sintered layer, the second sintered layer, and the plating layer, which are included in the surface electrode; the preferable thickness thereof; the preferable configuration of the exposed surface; and the like are the same as those described in the first embodiment.

Figure 4A:
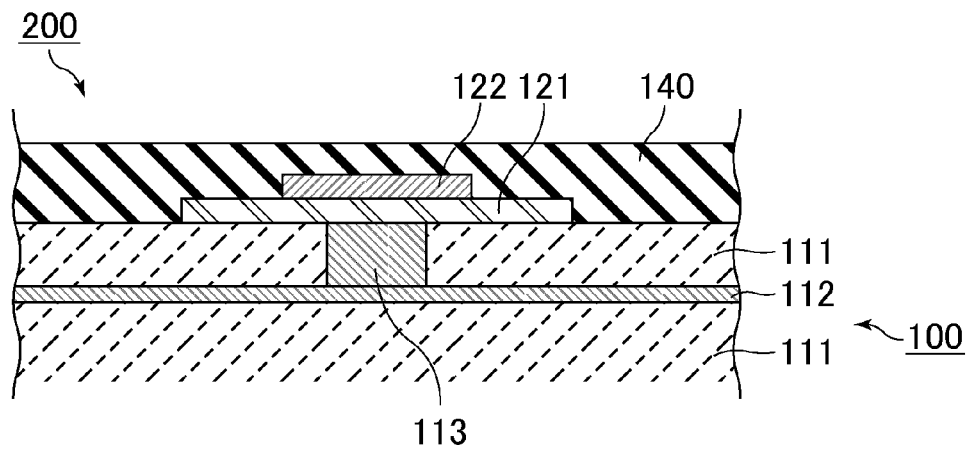
FIGS. 4A to 4C are schematic sectional views showing an example of a method for manufacturing the ceramic electronic component 2 shown in FIG. 3.
Figure 4B:
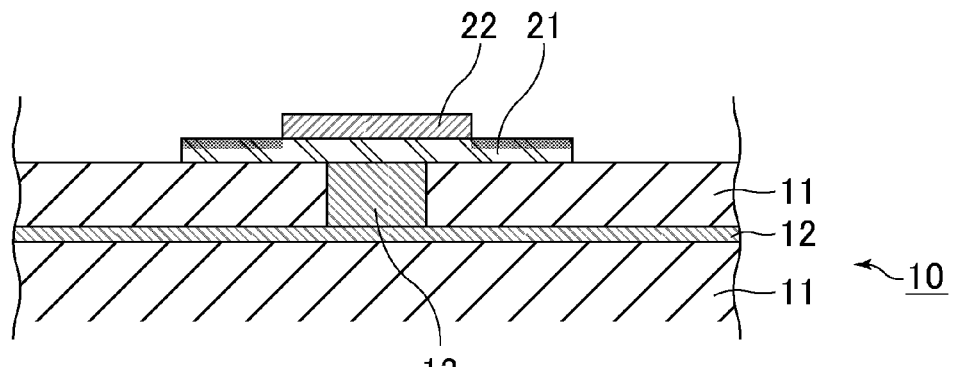
Figure 4C:
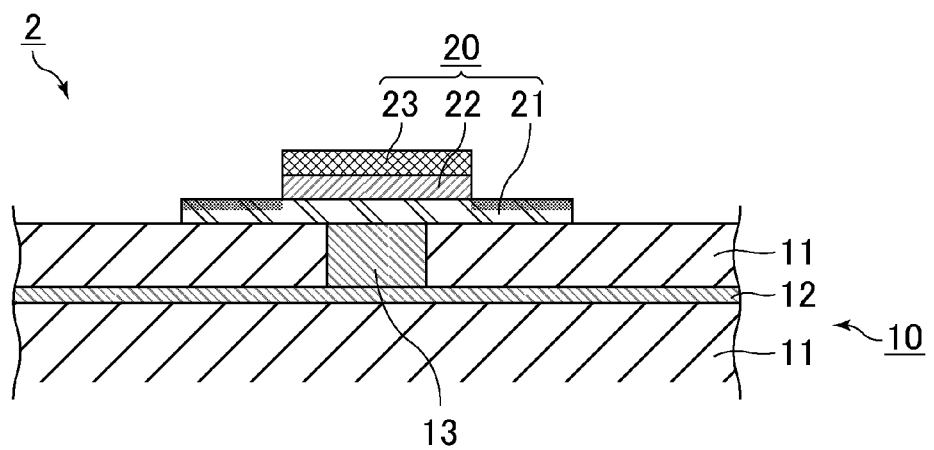

The ceramic electronic component 2 shown in FIG. 3 is preferably manufactured as described below. FIGS. 4A to 4C are schematic sectional views showing an example of a method for manufacturing the ceramic electronic component 2 shown in FIG. 3.

First, an unsintered composite multilayer body 200 is prepared as shown in FIG. 4A.

As shown in FIG. 4A, the unsintered composite multilayer body 200 has a structure in which a constraint green sheet 140 mainly containing a metal oxide that is not substantially sintered at the sintering temperature of the unsintered multilayer body 100 is placed on the outermost surface of the unsintered multilayer body 100 prepared in the first embodiment of the present invention.

The constraint green sheet is preferably one obtained by forming slurry containing a powder of the metal oxide, an organic binder, and a solvent into a sheet by a doctor blade process or the like. The slurry may contain various additives such as a dispersant and a plasticizer.

Examples of the metal oxide contained in the slurry include $Al_2O_3$, $ZrO_2$, $TiO_2$, $SiO_2$, and MgO. Among these oxides, $Al_2O_3$ is preferably used.

The unsintered composite multilayer body 200 can be prepared by stacking and then pressure-bonding a base ceramic green sheet 111 provided with a conductive paste body 113 to be converted into a via-hole conductor 13 or a conductive paste film 112 to be converted into an inner conductive film 12, a base ceramic green sheet 111 provided with a conductive paste film 121 to be converted into the first sintered layer 21 and a conductive paste film 122 to be converted into the second sintered layer 22, and the constraint green sheet 140 as required.

Incidentally, the unsintered composite multilayer body 200 can also be prepared in such a manner that, instead of the constraint green sheet 140, a paste-like composition is applied to the outermost surface of the unsintered multilayer body 100. In this case, the paste-like composition may be applied to the outermost surface of a base ceramic green sheet before stacking.

Thereafter, the unsintered composite multilayer body 200 is fired and a portion derived from the constraint green sheet 140 is removed. This allows a multilayer body including the electronic component body 10, which includes the superficial base ceramic layer 11; the first sintered layer 21, which is placed on the upper surface of the base ceramic layer 11; and the second sintered layer 22, which is placed on the upper surface of the first sintered layer 21, to be obtained as shown in FIG. 4B.

The constraint green sheet 140 is not substantially sintered during firing, therefore does not shrink, and acts to suppress the shrinkage of the multilayer body 100 in principal surface directions. Furthermore, the upper surface of the conductive paste film 121 to be converted into the first sintered layer 21, which contains the metal oxide, reacts with the constraint green sheet 140 and the metal oxide contained in the constraint green sheet 140 probably diffuses and permeates into the conductive paste film 121. As a result, a region having a metal oxide content higher than that of the boundary surface in contact with the base ceramic layer 11 is formed in the upper surface of the first sintered layer 21, which is obtained after firing. Incidentally, since side surfaces of the conductive paste film 121 to be converted into the first sintered layer 21 probably react with the constraint green sheet 140, regions having a metal oxide content higher than that of the boundary surface in contact with the base ceramic layer 11 may be formed in side surfaces of the first sintered layer 21, which is obtained after firing. On the other hand, since the conductive paste film 122 to be converted into the second sintered layer 22 contains no metal oxide, sintering is probably quickly completed before the reaction with the constraint green sheet 140.

After the unsintered composite multilayer body 200 is fired and the portion derived from the constraint green sheet 140 is removed, the plating layer 23 is formed on the upper surface of the second sintered layer 22 by electroplating or electroless plating as shown in FIG. 4C.

The above allows the ceramic electronic component 2, in which the surface electrode 20 including the first sintered layer 21, the second sintered layer 22, and the plating layer 23 is placed on a surface of the electronic component body 10, to be obtained.

In the above method, the conductive paste to be formed into the first sintered layer contains the metal oxide and the content of the metal oxide at the upper surface of the first sintered layer is relatively high due to the reaction with the constraint green sheet; hence, no plating layer is formed on the upper surface of the first sintered layer. However, the conductive paste to be formed into the second sintered layer contains no metal oxide and does not react with the constraint green sheet; hence, the plating layer is formed on the upper surface of the second sintered layer. As a result, the exposed surface, which is not overlaid with the second sintered layer or the plating layer, is formed in the peripheral section of the first sintered layer.

In the second embodiment of the present invention, as well as the first embodiment, forming the exposed surface, which is not overlaid with the second sintered layer or the plating layer, in the upper surface of the peripheral section of the first sintered layer enables the second sintered layer and the plating layer to be placed inside the first sintered layer. As a result, the bond strength between the surface electrode and the electronic component body can be increased to a level sufficient to withstand the stress applied to the surface electrode from outside. Therefore, cracks can be prevented from occurring in the surface electrode and/or the electronic component body.

Furthermore, in the second embodiment of the present invention, the content of the metal oxide at the exposed surface of the first sintered layer that is not overlaid with the second sintered layer or the plating layer is adjusted above the content of the metal oxide at the boundary surface of the first sintered layer that is in contact with the base ceramic layer by firing using the constraint green sheet, thereby enabling the bond strength between the surface electrode and the electronic component body to be further increased.

Third Embodiment

Figure 5:
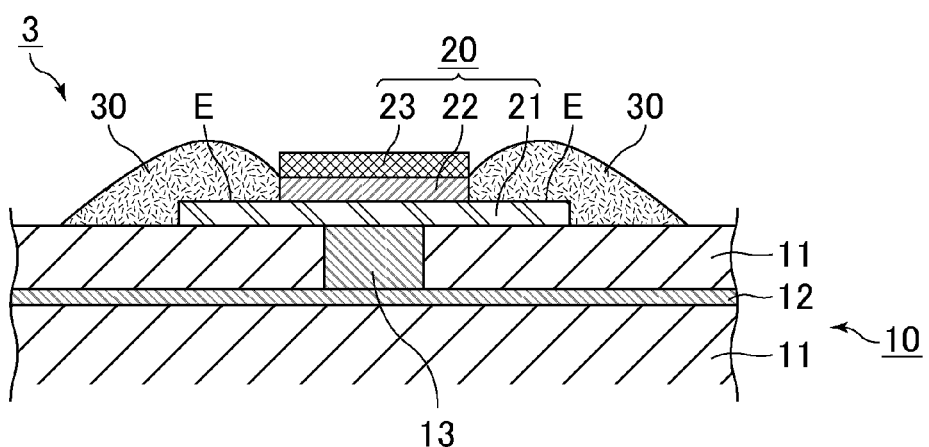
FIG. 5 is a schematic sectional view of an example of a ceramic electronic component according to a third embodiment of the present invention.

FIG. 5 is a schematic sectional view of an example of a ceramic electronic component according to a third embodiment of the present invention.

The ceramic electronic component 3, of which the overall configuration is not shown in FIG. 5, includes an electronic component body 10 including a superficial base ceramic layer 11 and also includes a surface electrode 20 placed on a surface of the electronic component body 10. The surface electrode 20 has a three-layer structure and includes a first sintered layer 21 placed on the upper surface of the base ceramic layer 11, which is located at a surface of the electronic component body 10; a second sintered layer 22 placed on the upper surface of the first sintered layer 21; and a plating layer 23 placed on the upper surface of the second sintered layer 22.

A peripheral section of the first sintered layer 21 has an exposed surface E which is not overlaid with the second sintered layer 22 or the plating layer 23.

As shown in FIG. 5, the ceramic electronic component 3 further includes a covering ceramic layer 30 covering a peripheral section of the surface electrode 20. As shown in FIG. 5, in the ceramic electronic component 3, the covering ceramic layer 30 is placed on the base ceramic layer 11, which is located at a surface of the electronic component body 10, and on the first sintered layer 21 and completely covers the exposed surface E of the first sintered layer 21.

Figure 6:
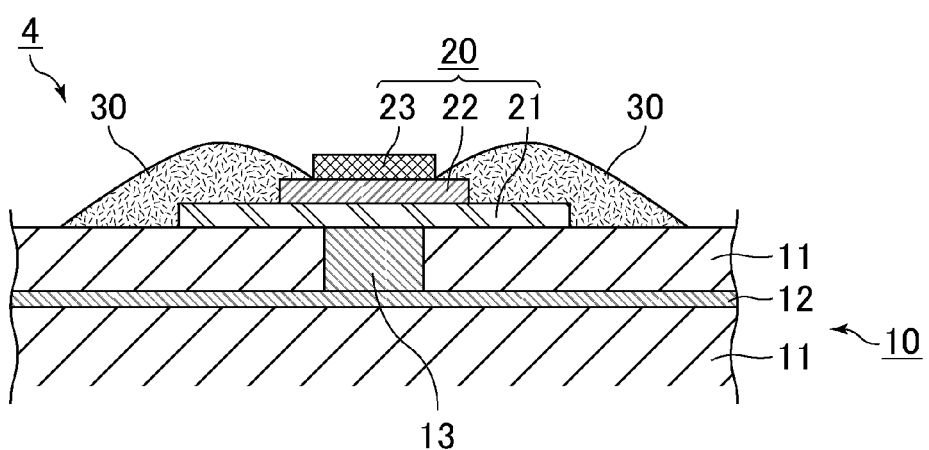
FIG. 6 is a schematic sectional view of another example of the ceramic electronic component according to the third embodiment of the present invention.

FIG. 6 is a schematic sectional view of another example of the ceramic electronic component according to the third embodiment of the present invention.

In a ceramic electronic component 4 shown in FIG. 6, a covering ceramic layer 30 is placed on a base ceramic layer 11 located at a surface of an electronic component body 10, a first sintered layer 21, and a second sintered layer 22 and completely covers an exposed surface E of the first sintered layer 21.

The covering ceramic layer may partly cover the exposed surface of the first sintered layer and preferably completely covers the exposed surface of the first sintered layer as shown in FIGS. 5 and 6. When the covering ceramic layer is also placed on the second sintered layer as shown in FIG. 6, the plating layer is placed on the upper surface of the second sintered layer that is not overlaid with the covering ceramic layer.

When a portion of the peripheral section of the surface electrode has no exposed surface, the covering ceramic layer is preferably placed so as to cover the peripheral section of the surface electrode that has no exposed surface.

The covering ceramic layer preferably contains a low-temperature co-fired ceramic material. In this case, the low-temperature co-fired ceramic material contained in the covering ceramic layer may be the same as or different from a low-temperature co-fired ceramic material contained in the base ceramic layer and is preferably the same as the low-temperature co-fired ceramic material contained in the base ceramic layer.

The covering ceramic layer may contain the same metal oxide as a metal oxide contained in the first sintered layer. When the covering ceramic layer contains the metal oxide, the content of the metal oxide in the covering ceramic layer is preferably less than 5% by weight.

The thickness of the covering ceramic layer is not particularly limited and is preferably 0.5 μm to 40 μm.

The ceramic electronic component according to the third embodiment of the present invention has the same configuration as that of the ceramic electronic component according to the first embodiment except that the ceramic electronic component according to the third embodiment includes the covering ceramic layer.

Thus, in the third embodiment of the present invention, the configuration of the electronic component body is the same as that described in the first embodiment and a preferable material for the base ceramic layer included in the electronic component body is the same as that described in the first embodiment. The conductive component contained in the first sintered layer, the second sintered layer, and the plating layer, which are included in the surface electrode; the preferable thickness thereof; the preferable configuration of the exposed surface; and the like are the same as those described in the first embodiment.

Figure 7A:
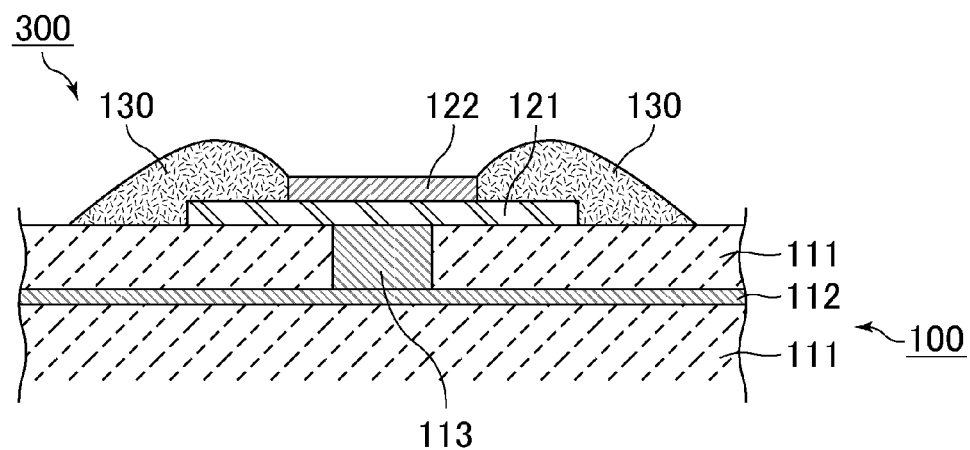
FIGS. 7A to 7C are schematic sectional views showing an example of a method for manufacturing the ceramic electronic component 3 shown in FIG. 5.
Figure 7B:
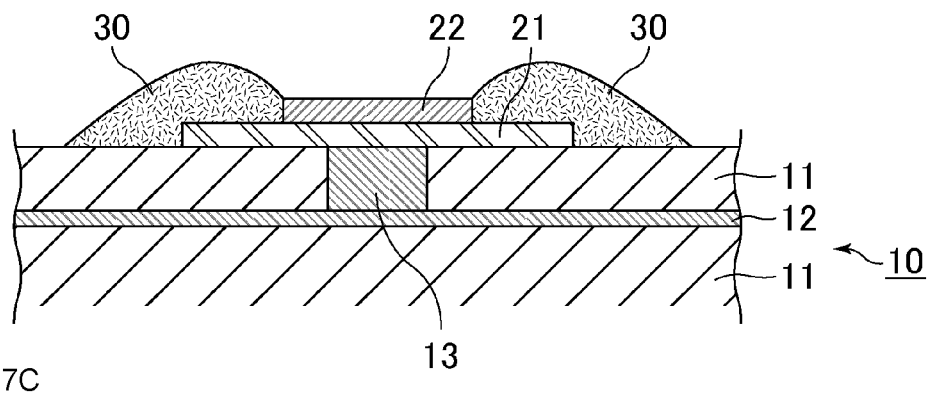
Figure 7C:
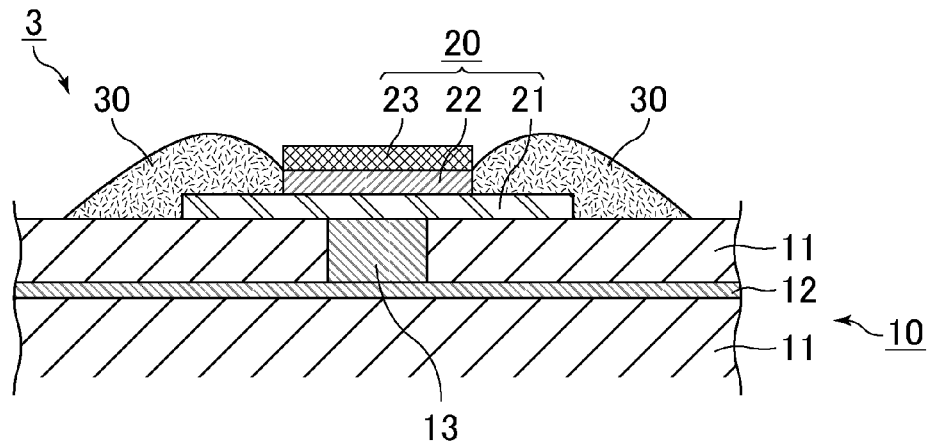
Figure 8A:
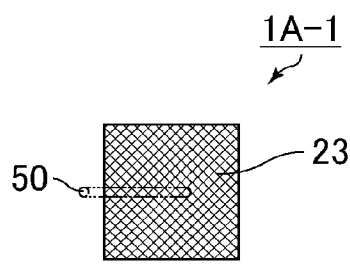
FIGS. 8(a) to 8(f) are plan views of ceramic electronic components 1A-1 to 1A-6.
Figure 8B:
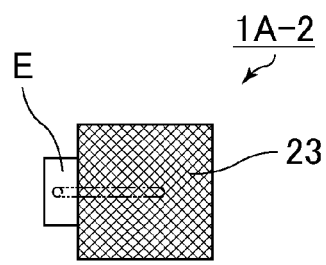
Figure 8C:
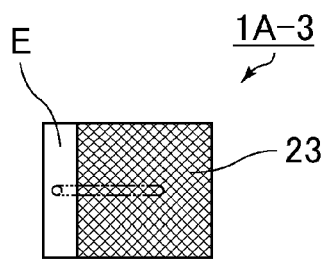
Figure 8D:
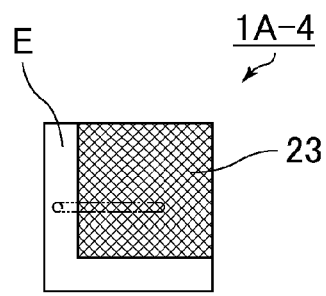
Figure 8E:
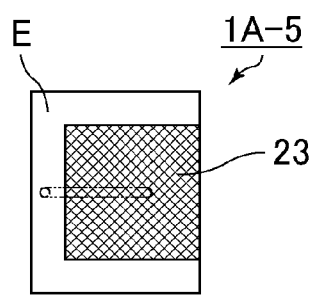
Figure 8F:
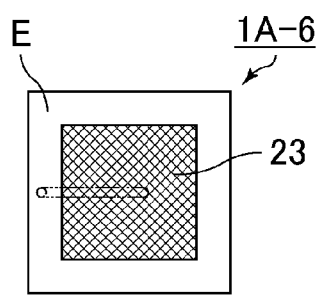

The ceramic electronic component 3 shown in FIG. 5 is preferably manufactured as described below. FIGS. 7A to 7C are schematic sectional views showing an example of a method for manufacturing the ceramic electronic component 3 shown in FIG. 5.

First, an unsintered multilayer body 300 is prepared as shown in FIG. 7A.

As shown in FIG. 7A, the unsintered multilayer body 300 has a structure in which a covering ceramic green sheet 130 is placed on a base ceramic green sheet 111 located at a surface of the unsintered multilayer body 100 prepared in the first embodiment of the present invention and on a conductive paste film 121 to be converted into the first sintered layer 21. The covering ceramic green sheet 130 is one converted into the covering ceramic layer 30 after firing.

The covering ceramic green sheet is one obtained by forming, for example, slurry containing a powder of a ceramic raw material such as a low-temperature co-fired ceramic material, an organic binder, and a solvent into a sheet by a doctor blade process or the like. The slurry may contain various additives such as a dispersant and a plasticizer. The slurry used to prepare the covering ceramic green sheet may be used to prepare base ceramic green sheets.

The unsintered multilayer body 300 can be prepared by stacking and then pressure-bonding a base ceramic green sheet 111 provided with a conductive paste body 113 to be converted into a via-hole conductor 13 or a conductive paste film 112 to be converted into an inner conductive film 12, a base ceramic green sheet 111 provided with a conductive paste film 121 to be converted into the first sintered layer 21 and a conductive paste film 122 to be converted into the second sintered layer 22, and the covering ceramic green sheet 130 as required.

The covering ceramic green sheet 130 is placed on a superficial base ceramic green sheet 111 after stacking and on the conductive paste film 121 to be converted into the first sintered layer 21 so as to cover a region not overlaid with the conductive paste film 122 to be converted into the second sintered layer 22.

Incidentally, the unsintered multilayer body 300 can also be prepared in such a manner that, instead of the covering ceramic green sheet 130, a paste-like composition is applied to a base ceramic green sheet 111 located at a surface of the unsintered multilayer body 300 and to the conductive paste film 121 to be converted into the first sintered layer 21. In this case, the paste-like composition may be applied to the base ceramic green sheet 111 and the conductive paste film 121 to be converted into the first sintered layer 21 before stacking.

Thereafter, the unsintered multilayer body 300 is fired. This allows a multilayer body including the electronic component body 10, which includes the superficial base ceramic layer 11; the first sintered layer 21, which is placed on the upper surface of the base ceramic layer 11; the second sintered layer 22, which is placed on the upper surface of the first sintered layer 21; and the covering ceramic layer 30, which is placed on the base ceramic layer 11 and the first sintered layer 21; to be obtained as shown in FIG. 7B.

After the unsintered multilayer body 300 is fired, the plating layer 23 is formed on the upper surface of the second sintered layer 22 by electroplating or electroless plating as shown in FIG. 7C.

The above allows the ceramic electronic component 3, in which the surface electrode 20 including the first sintered layer 21, the second sintered layer 22, and the plating layer 23 is placed on a surface of the electronic component body 10 and the covering ceramic layer 30 covers the peripheral section of the surface electrode 20, to be obtained.

In the above method, since the conductive paste to be formed into the first sintered layer contains the metal oxide and the covering ceramic layer is placed on, no plating layer is formed on the upper surface of the first sintered layer. However, since the conductive paste to be formed into the second sintered layer contains no metal oxide, the plating layer is formed on the upper surface of the second sintered layer. As a result, the exposed surface, which is not overlaid with the second sintered layer or the plating layer, is formed in the peripheral section of the first sintered layer.

Incidentally, as is the case with the second embodiment of the present invention, a constraint green sheet mainly containing a metal oxide ($Al_2O_3$ or the like) that is not substantially sintered at the sintering temperature of the unsintered multilayer body 300 is prepared and the unsintered multilayer body 300 may be fired in such a state that the constraint green sheet is placed on the outermost surface of the unsintered multilayer body 300. In this case, the constraint green sheet is not substantially sintered during firing, therefore does not shrink, and acts to suppress the shrinkage of the multilayer body in principal surface directions.

In the third embodiment of the present invention, as well as the first embodiment, forming the exposed surface, which is not overlaid with the second sintered layer or the plating layer, in the upper surface of the peripheral section of the first sintered layer enables the second sintered layer and the plating layer to be placed inside the first sintered layer. As a result, the bond strength between the surface electrode and the electronic component body can be increased to a level sufficient to withstand the stress applied to the surface electrode from outside. Therefore, cracks can be prevented from occurring in the surface electrode and/or the electronic component body.

In the third embodiment of the present invention, providing the covering ceramic layer, which is called a framing layer, on the peripheral section of the surface electrode enables the deterioration of high-frequency characteristics of the surface electrode to be prevented.

Furthermore, providing the covering ceramic layer such that the covering ceramic layer covers the exposed surface of the first sintered layer enables the distance between the covering ceramic layer and the base ceramic layer to be reduced as compared to providing the covering ceramic layer such that the covering ceramic layer covers a peripheral section of a second sintered layer stacked on a first sintered layer having no exposed surface. When the first sintered layer contains the metal oxide, the adhesion between the covering ceramic layer and the first sintered layer can be increased. As a result, the adhesion between the covering ceramic layer and the surface electrode can be increased. Therefore, even in the case where the ceramic electronic component is subjected to a surface treatment such as blasting, the covering ceramic layer can be prevented from being peeled from the surface electrode.

Examples

Examples disclosing a ceramic electronic component according to the present invention in detail are described below. The present invention is not limited to the examples only.

[Relationship Between Ratio of Length of Inner Edge of Exposed Surface to Length of Peripheral Section of Second Sintered Layer and Bond Strength]

FIGS. 8(a) to 8(f) are plan views of ceramic electronic components 1A-1 to 1A-6.

As shown in FIGS. 8(a) to 8(f), the ceramic electronic components 1A-1 to 1A-6 were prepared such that second sintered layers (not shown) and plating layers 23 had a size of 2 mm×2 mm and exposed surfaces E had a width of 100 μm and different sizes. Twenty of the ceramic electronic components with each size were prepared and were subjected to an electrode tensile test with an N of 20, whereby the bond strength between a base ceramic layer and a surface electrode was measured. In FIGS. 8(a) to 8(f), the position of a metal rod 50 shown in FIGS. 9(a) and 9(b) is shown with a dashed line.

Each of the ceramic electronic components 1A-1 to 1A-6 was prepared in such a manner that a surface electrode including a first sintered layer, second sintered layer, and plating layer arranged from the base ceramic layer side was formed on a surface of a base ceramic layer made of a low-temperature co-fired ceramic material. The first sintered layer was formed by baking a conductive paste (an $Al_2O_3$ content of 3% by weight) containing Cu as a conductive material and $Al_2O_3$ as a metal oxide. The second sintered layer was formed by baking a conductive paste containing Cu as a conductive material. For the plating layer, a Ni plating film and an Au plating film were formed from the second sintered layer side.

Figure 9A:
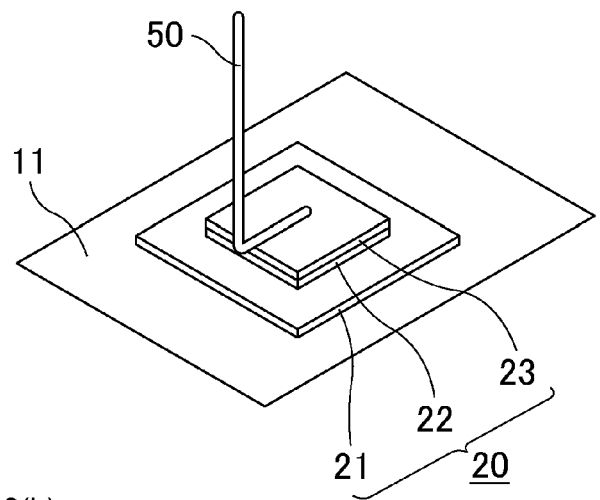
FIGS. 9(a) and 9(b) are schematic views showing an electrode tensile test method.
Figure 9B:
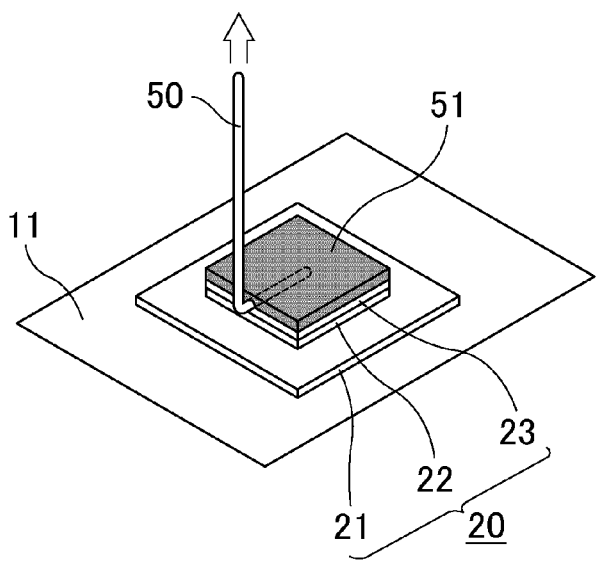

FIGS. 9(a) and 9(b) are schematic views showing an electrode tensile test method.

After the metal rod 50 was put on a plating layer 23 of a surface electrode 20 including a first sintered layer 21, a second sintered layer 22, and the plating layer 23 arranged from the base ceramic layer 11 side, the metal rod 50 was fixed with solder 51 and the strength to pull the metal rod 50 was measured. This allowed the bond strength between a base ceramic layer located at a surface of an electronic component body and the surface electrode to be evaluated.

Table 1 shows an exposure condition of the exposed surface of each of the ceramic electronic components 1A-1 to 1A-6, the ratio of the length of the inner edge of the exposed surface to the length of a peripheral section of the second sintered layer, bond strength, fracture modes, the percentage of solder fracture, and judgment results.

Among the fracture modes, substrate fracture is a phenomenon in which a surface base ceramic layer is hollowed because the strength of an electronic component body is low, electrode fracture is a phenomenon in which a surface electrode is peeled from a base ceramic layer because the bond between the base ceramic layer and the surface electrode is weak, and solder fracture is a phenomenon in which a metal rod is isolated from solder because the bond between a base ceramic layer and a surface electrode is sufficiently strong. The solder fracture means that the surface electrode is not peeled from the base ceramic layer and therefore the actual bond strength is not less than a measurement.

In the judgment results, one in which the bond strength and the percentage of solder fracture were increased was rated ○ (good) and one in which the bond strength was 60 N or more and the percentage of solder fracture was 80% or more was rated ☉ (excellent) on the basis of the ceramic electronic component 1A-1.

TABLE 1

| No. | Exposure condition | Exposed surface Ratio of length of inner edge to length of peripheral section of second sintered layer | Evaluation Bond strength [N] | Fracture mode | Percentage of solder fracture | Judgment result |
|---|---|---|---|---|---|---|
| 1A-1* | Not exposed | 0% | 32 | Substrate fracture | 0% | — |
| 1A-2 | One side exposed (half) | 12.5% | 45 | Substrate fracture/ electrode fracture/ solder fracture | 30% | ○ |
| 1A-3 | One side exposed | 25% | 56 | Substrate fracture/ electrode fracture/ solder fracture | 50% | ○ |
| 1A-4 | Two sides exposed | 50% | 60 | Substrate fracture/ electrode fracture/ solder fracture | 80% | ☉ |
| 1A-5 | Three sides exposed | 75% | 65 | Solder fracture | 100% | ☉ |
| 1A-6 | Four sides exposed | 100% | 63 | Solder fracture | 100% | ☉ |

In Table 1, the ceramic electronic component 1A-1, which is asterisked, is outside the scope of the present invention.

As is confirmed from Table 1, in the ceramic electronic components 1A-2 to 1A-6, which have the exposed surface, the bond strength between the base ceramic layer and the surface electrode and the percentage of solder fracture are increased as compared to the ceramic electronic component 1A-1, which has no exposed surface. In particular, it is confirmed that when the ratio of the length of the inner edge of an exposed surface to the length of a peripheral section of a second sintered layer is 12.5% or more, the bond strength between the base ceramic layer and the surface electrode and the percentage of solder fracture tend to be increased.

From the about results, it is conceivable that forming an exposed surface enables the origin of the stress due to soldering to be shifted from an end portion of a surface electrode that has low bond strength to the inside of the surface electrode that has high bond strength and therefore the bond strength between the surface electrode and an electronic component body can be increased.

[Relationship Between Width of Exposed Surface and Bond Strength]

Ceramic electronic components 1B-1 to 1B-6 (listed in Table 2) were prepared such that each of exposed surfaces was exposed from four sides of a corresponding one of second sintered layers and the exposed surfaces had different widths (similar to the structure shown as 1A-6 of FIG. 8(*f*)). Each ceramic electronic component was subjected to the above electrode tensile test, whereby the bond strength between a base ceramic layer and a surface electrode was measured. Results of the bond strength are shown in Table 2.

Each ceramic electronic component was subjected to a drop test by a method below, whereby the drop strength thereof was evaluated.

First, the ceramic electronic component was reflowed in such a manner that a solder paste was applied to a printed wiring board with a substrate thickness of 1.0 mm and the ceramic electronic component was mounted on the printed wiring board such that the surface electrode was located on the solder paste.

Next, the printed wiring board provided with the ceramic electronic component was attached to a substantially cuboid resin housing such that a mounting surface was a lower surface. In this operation, the sum of the weight of the resin housing and the weight of the printed wiring board provided with the ceramic electronic component was adjusted to 100 g.

The drop test was repeated ten times in such a manner that the resin housing was held at a predetermined height and was dropped on a stationary concrete block of which the upper surface was horizontal such that the resin housing collided with the concrete block in such a state that the lower surface of the resin housing was parallel to the upper surface of the concrete block, whereby the fracture condition of the ceramic electronic component was checked.

The drop strength was evaluated as follows: one in which the occurrence of a crack by dropping one time was observed in a region provided with a surface electrode was rated x (poor), one in which the occurrence of a crack by dropping two times to ten times was observed was rated ○ (good), and one in which the occurrence of a crack by dropping ten times was not observed was rated ☉ (excellent). Results of the drop strength are shown in Table 2.

TABLE 2

| No. | Width of exposed surface [μm] | Bond strength [N] | Drop strength |
|---|---|---|---|
| 1B-1* | 0 | 35 | X |
| 1B-2 | 3 | 35 | ○ |
| 1B-3 | 5 | 40 | ○ |
| 1B-4 | 10 | 65 | ☉ |
| 1B-5 | 50 | 70 | ☉ |
| 1B-6 | 100 | 65 | ☉ |

In Table 2, the ceramic electronic component 1B-1, which is asterisked, is outside the scope of the present invention.

As is confirmed from Table 2, in the ceramic electronic component 1B-1, which has no exposed surface, a crack occurred by dropping one time and, in the ceramic electronic components 1B-2 to 1B-6, which have the exposed surfaces, the occurrence of a crack by dropping one time can be prevented and the bond strength is high. In particular, it is confirmed that, in the ceramic electronic components 1B-4 to 1B-6, in which the width of each exposed surface is 10 μm or more, the bond strength and the drop strength are both high.

From the above results, it is conceivable that increasing the width of an exposed surface enables the load of stress on an end portion of a surface electrode to be reduced and, as a result, the bond strength between the surface electrode and an electronic component body can be increased.

[Increase of Bond Strength by Use of Constraint Green Sheet]

Ceramic electronic components 2-1 to 2-6, as well as the ceramic electronic components 1B-1 to 1B-6, were prepared such that each of exposed surfaces was exposed from four sides of a corresponding one of second sintered layers and the exposed surfaces had different widths. However, in the course of preparing each of the ceramic electronic components 2-1 to 2-6, a constraint green sheet mainly containing $Al_2O_3$ was provided on the outermost surface of an unsintered multilayer body, the unsintered multilayer body was fired, and a portion derived from the constraint green sheet was removed after firing as described in the second embodiment.

The obtained ceramic electronic components 2-1 to 2-6 were measured for bond strength and were evaluated for drop strength by substantially the same methods as above. Results of the bond strength and the drop strength are shown in Table 3.

TABLE 3

| No. | Width of exposed surface [μm] | Bond strength [N] | Drop strength |
|---|---|---|---|
| 2-1* | 0 | 35 | X |
| 2-2 | 3 | 40 | ○ |
| 2-3 | 5 | 45 | ○ |
| 2-4 | 10 | 70 | ⊙ |
| 2-5 | 50 | 70 | ⊙ |
| 2-6 | 100 | 70 | ⊙ |

In Table 3, the ceramic electronic component 2-1, which is asterisked, is outside the scope of the present invention.

As is confirmed from Table 3, in the ceramic electronic components 2-2 to 2-6, which were prepared using the constraint green sheets, as well as the ceramic electronic components 1B-2 to 1B-6, forming an exposed surface allows the bond strength to be increased. In particular, it is confirmed that, in the ceramic electronic components 2-4 to 2-6, in which the width of the exposed surface is 10 μm or more, the bond strength and the drop strength are both high.

Furthermore, it is confirmed that the ceramic electronic components 2-2 to 2-6 have increased bond strength as compared to the ceramic electronic components 1B-2 to 1B-6.

This is probably because the upper surface of a conductive paste film to be converted into a first sintered layer reacts with a constraint green sheet during firing, resulting in that a region having a metal oxide content higher than that of a boundary surface in contact with a base ceramic layer is formed in the upper surface of the first sintered layer.

[Increase in Adhesion Between Covering Ceramic Layer and Surface Electrode Due to Covering Ceramic Layer]

Ceramic electronic components 3-1 to 3-6, as well as the ceramic electronic components 1B-1 to 1B-6, were prepared such that each of exposed surfaces was exposed from four sides of a corresponding one of second sintered layers and the exposed surfaces had different widths. However, in the course of preparing each of the ceramic electronic components 3-1 to 3-6, a covering ceramic layer covering a peripheral section of a surface electrode was formed so as to completely cover an exposed surface of a first sintered layer as described in the third embodiment.

The obtained ceramic electronic components 3-1 to 3-6 were blasted for the purpose of removing surface stains. After blasting, a cross section of each ceramic electronic component was polished and whether delamination occurred at the interface between the covering ceramic layer and the surface electrode was checked, whereby the adhesion between the covering ceramic layer and the surface electrode was evaluated. By substantially the same methods as above, the bond strength was measured and the drop strength was evaluated.

The adhesion between a covering ceramic layer and a surface electrode was evaluated as follows: one in which no delamination occurred at the interface between a covering ceramic layer and a surface electrode was rated ○ (good) and one in which delamination occurred was rated x (poor). Results are shown in Table 4.

TABLE 4

| No. | Width of exposed surface [μm] | Delamination at interface between covering ceramic layer and surface electrode | Adhesion between covering ceramic layer and surface electrode | Bond strength [N] | Drop strength |
|---|---|---|---|---|---|
| 3-1* | 0 | Observed | C | 35 | X |
| 3-2 | 3 | Not observed | B | 47 | ○ |
| 3-3 | 5 | Not observed | B | 56 | ○ |
| 3-4 | 10 | Not observed | B | 70 | ⊙ |
| 3-5 | 50 | Not observed | B | 70 | ⊙ |
| 3-6 | 100 | Not observed | B | 70 | ⊙ |

In Table 4, the ceramic electronic component 3-1, which is asterisked, is outside the scope of the present invention.

As is confirmed from Table 4, in the ceramic electronic component 3-1, which has no exposed surface, delamination occurred at the interface between the covering ceramic layer and the surface electrode and, in the ceramic electronic components 3-2 to 3-6, which have the exposed surface, no delamination occurred at the interface between the covering ceramic layer and the surface electrode and the adhesion between the covering ceramic layer and the surface electrode is high.

This is probably because a first sintered layer containing a metal oxide has higher adhesion to a covering ceramic layer as compared to a second sintered layer contain no metal oxide and therefore forming the covering ceramic layer such that the covering ceramic layer covers an exposed surface of the first sintered layer increases the adhesion between the covering ceramic layer and the surface electrode.

In particular, it is confirmed that, in the ceramic electronic components 3-4 to 3-6, in which the width of the exposed surface is 10 μm or more, the bond strength and the drop strength are both high.

This is probably because increasing the width of an exposed surface enables the load of stress on an end portion of a surface electrode to be reduced and, as a result, the bond strength between the surface electrode and an electronic component body can be increased.

REFERENCE SIGNS LIST 1, 2, 3, 4 Ceramic electronic component
10 Electronic component body
11 Base ceramic layer
20 Surface electrode
21 First sintered layer
22 Second sintered layer
23 Plating layer
30 Covering ceramic layer
B Boundary surface (boundary surface of first sintered layer that is in contact with base ceramic layer)
E Exposed surface
W Width of exposed surface

The invention claimed is:

1. A ceramic electronic component comprising:
an electronic component body including a superficial base ceramic layer and a surface electrode on the electronic component body,
wherein the surface electrode includes:
    a first sintered layer on the superficial base ceramic layer;
    a second sintered layer on the first sintered layer; and
    a plating layer on the second sintered layer such that the second sintered layer is between the first sintered layer and the plating layer, wherein
    the first sintered layer contains a metal oxide;
    a first peripheral section of the first sintered layer has an exposed surface which is not overlaid with the second sintered layer or the plating layer,
    a first content of the metal oxide at the exposed surface of the first sintered layer is higher than a second content of the metal oxide at a boundary surface of the first sintered layer that is in contact with the base ceramic layer,
    a length of an inner edge of the exposed surface is 50% or more of a length of a second peripheral section of the second sintered layer, and a width of the exposed surface is 10 μm to 50 μm, and
    the second sintered layer contains the metal oxide, wherein the amount of metal oxide in the second sintered layer is smaller than that of the first sintered layer; and
    a covering ceramic layer covering the exposed surface of the first sintered layer.

2. The ceramic electronic component according to claim 1, wherein a content of the metal oxide in the first sintered layer is 1% by weight to less than 10% by weight.

3. The ceramic electronic component according to claim 1, wherein a content of the metal oxide in the first sintered layer is 3% by weight to less than 5% by weight.

4. The ceramic electronic component according to claim 1, wherein the covering ceramic layer contains the same metal oxide as the first sintered layer.

5. The ceramic electronic component according to claim 1, wherein the superficial base ceramic layer contains a low-temperature co-fired ceramic material.

6. The ceramic electronic component according to claim 5, wherein the covering ceramic layer contains the same low-temperature co-fired ceramic material as the superficial base ceramic layer.

7. The ceramic electronic component according to claim 1, wherein a width of the exposed surface is 4.5% to 50% of a width of the surface electrode.

8. The ceramic electronic component according to claim 1, wherein a width of the exposed surface is 10% to 25% of a width of the surface electrode.

9. The ceramic electronic component according to claim 1, wherein an area of the exposed surface is 0.1% to 50% of an area of the upper surface of the first sintered layer.

10. The ceramic electronic component according to claim 1, wherein an area of the exposed surface is 1% to 10% of an area of the upper surface of the first sintered layer.

11. The ceramic electronic component according to claim 1, wherein the metal oxide contains at least one first metal element selected from Al, Zr, Si, and Mg.

12. The ceramic electronic component according to claim 11, wherein the first sintered layer includes at least one second metal element selected from Ag and Cu.

* * * * *